United States Patent [19]
Barbetta

[11] Patent Number: 5,815,040
[45] Date of Patent: Sep. 29, 1998

[54] WIDE BANDWIDTH, CURRENT SHARING, MOSFET AUDIO POWER AMPLIFIER WITH MULTIPLE FEEDBACK LOOPS

[75] Inventor: Anthony T. Barbetta, 5301 Commerce Ave. #5, Moorpark, Calif. 93021

[73] Assignee: Anthony T. Barbetta, Moorpark, Calif.

[21] Appl. No.: 774,537

[22] Filed: Dec. 30, 1996

[51] Int. Cl.[6] .................................................. H03F 3/30
[52] U.S. Cl. ...................... 330/264; 330/100; 330/102; 330/105; 330/255; 330/265; 381/121
[58] Field of Search ................................. 330/98, 99, 100, 330/102, 105, 255, 264, 265, 269, 271, 276; 381/121

[56] References Cited

U.S. PATENT DOCUMENTS 4,464,634  8/1984  Velazquez ........................ 330/265 X

*Primary Examiner*—James B. Mullins
*Attorney, Agent, or Firm*—D'Alessandro & Ritchie

[57] ABSTRACT

A wide bandwidth, multi-FET current sharing output stage, MOS audio power amplifier employs multiple feedback loops. An audio input is supplied to a voltage feedback amplifier stage driving a push-pull voltage gain/phase splitter stage. A bias adjustment stage driven from the push-pull voltage gain/phase splitter stage drives a current drive stage. The current drive stage drives an output stage comprising a plurality of paralleled current shared individual MOS output transistors driving an output node connected to a load. Up to three feedback loops are employed. A first voltage feedback loop comprises a voltage feedback stage having an input connected to a voltage divider driven from the first terminal of the load and an output connected to a feedback input node in the voltage feedback amplifier stage. A second voltage feedback loop comprises a voltage feedback stage having an input connected to the first terminal of the load and an output connected to a feedback input node in the push-pull voltage gain/phase splitter stage. A third feedback loop comprises a current feedback stage having an input in series between the output node and the load and an output connected to a feedback input node in the voltage feedback amplifier stage. The current feedback connection works in conjunction with input stage to lower distortion and provide a relatively flat frequency response.

1 Claim, 14 Drawing Sheets

Input Stage

PRIOR ART

WIDE BANDWIDTH, CURRENT SHARING, MOSFET AUDIO POWER AMPLIFIER WITH MULTIPLE FEEDBACK LOOPS

BACKGROUND OF THE INVENTION

1. Field of the Invention

The present invention pertains to audio amplifiers. More particularly, the present invention pertains to wide bandwidth, current sharing, mosfet audio power amplifier with multiple feedback loops.

2. The Prior Art

MOSFET transistors have a number of advantages when used in audio power output stages. The complementary push-pull source follower stage such as is typically employed in such applications is essentially a voltage operated current output device with extremely high input impedance, thus requiring very small drive currents in the micro-ampere range. These small drive currents are well within the output capability of low level linear circuits such as monolithic operational amplifiers.

Such MOSFET transistors are extremely stable in the source follower connection because they have a voltage gain of less than unity. Further, they are easily driven to the power supply rails using traditional capacitor bootstrap techniques, and they perform well in releasing from the supply rail during maximum voltage excursion since they have virtually no internal carrier storage time, unlike bipolar devices which have a tendency to "stick" to the rail due to carrier storage.

Device capacitance presents little or no degradation of speed of MOSFET transistors in the linear mode because only very small currents are needed to modulate the gate voltage under dynamic conditions such as required in audio power amplifier applications. This feature is considered to contribute to the extremely low transient intermodulation distortion performance of these devices.

While they have a certain amount of capacitance between the gate, source and drain, which must be charged and discharged by the gate drive mechanism, the impact on device bandwidth is small for two reasons. First, when driving the MOSFET devices in the linear region, only small changes in gate voltage are necessary to command large changes in drain/source current. Thus, only small currents are necessary to cause appropriate gate voltage changes. Second, bandwidth is virtually un-affected because the typical 100 ohm resistor commonly used as a gate isolation device and which forms a low pass filter with the device capacitance, typically has a pole at several megahertz, which is well above any recognized bandwidth of interest with regard to audio applications.

One of the fundamental disadvantages of MOSFET devices is that they exhibit a wide variation in gate threshold voltage among individual devices having the same part number, and a temperature coefficient of gate threshold that does not relate to bi-polar transistors, which makes it difficult to establish a quiescent bias point using traditional techniques.

In traditional class AB operation, which is defined as a conduction angle of 180 degrees for each transistor, provisions are made for the conduction period to overlap a few degrees to eliminate crossover distortion. Typically, large amounts of negative feedback are also employed to minimize this and other forms of distortion. In established topologies, the feedback connection is not sufficient to fully remove this error component from the audio output, which makes a certain amount of conduction overlap imperative.

Audio power stages with very large conduction overlap, such as class A amplifiers, are considered to have very low audible distortion but achieve this at the expense of very high power dissipation.

Large conduction overlap represents a power drain on the system, and generates heating of the output devices that must be addressed in heatsink design as well as device selection and sizing, and physical circuit layout. It would be advantageous to design a system that will provide a stable overlap region which is high enough to prevent crossover distortion yet low enough to minimize power dissipation with no input signal applied. Quiescent level power dissipation generates an undesirable temperature rise in the transistor heatsink.

In MOSFET devices there is also a lack of correlation between initial threshold voltage and linear transconductance, which makes them extremely difficult to match by selection of devices from a large batch of supposedly identical devices. This means that when devices are connected in parallel, they have to be matched for at least two different and un-related parameters: that of the transistor under quiescent conditions, and that of the transistor under load. This is a costly process, and in order to compensate for changes in matching of device characteristics with component aging, rational design would require excessive component de-rating, further raising the cost of a product into which they are designed.

Even with a single pair of complimentary output devices, quiescent bias presents difficulties because bipolar devices, which are convenient to use in driver and voltage gain stages, exhibit a temperature coefficient of −2.2 mv. per degree centigrade as opposed to −5 to −7 mv per degree C for MOSFET devices. Topologies can be devised to address these difficulties, but with virtually all of them, including those presented here, there remains a wide variation in output impedance, or damping factor in the crossover region. This is a significant cause of crossover distortion, which is well understood to be a particularly audible, and thus undesirable, form of power amplifier distortion.

Further, even the driving circuitry itself contributes to the tendency of audio amplifiers to exhibit wide variations in damping factor with changes in power level and frequency. It would be desirable to provide a feedback technique that will alleviate this effect. Such a technique would desirably be applied to amplifiers with other types of transistors in the output stage with equally advantageous effect.

Device manufacturers offer exhaustive descriptions of MOSFET parameters and their variations, as well as in-depth studies and discussions of the device characteristics and their implications. These are invaluable in formulating an understanding of the requirements for an easily biased and stable power output stage, but they do not suggest circuitry that will provide functional solutions for production designs.

Some commercially available audio products do successfully address these problems, although matching of components and/or sensitive circuit adjustments are not eliminated. Using a MOSFET as the biasing element for a single pair of output transistors is an effective technique, but it does not address the question of component variation in topologies where devices are connected in parallel. As a result, MOSFET power amplifiers have been confined to the realm of modest output power, or to expensive, hand built, esoteric audio products intended for a very small segment of the audio market. This leaves access to their many advantages economically out of reach for products intended to be sold at competitive prices.

It is thus an object of the present invention to provide a MOSFET audio amplifier circuit which overcomes some of the shortcomings of the prior art.

Another object of the present invention to provide a MOSFET audio amplifier circuit which is able to utilize the advantageous properties of MOSFET devices to as great an extent as possible.

A further object of the present invention to provide a MOSFET audio amplifier circuit which provides current sharing for output devices and has a high bandwidth.

These and other objects and advantages of the present invention will become apparent from the disclosure herein.

BRIEF DESCRIPTION OF THE INVENTION

An audio amplifier according to the present invention drives a plurality of paralleled current shared individual MOS output transistors. An audio input is supplied to a voltage feedback amplifier stage having an audio signal input. The voltage feedback amplifier stage drives a push-pull voltage gain/phase splitter stage. A bias adjustment stage is driven from the push-pull voltage gain/phase splitter stage. A current drive stage is driven from the bias adjustment stage. The current drive stage drives an output stage comprising a plurality of paralleled current shared individual MOS output transistors driving an output node. An output load has a first terminal connected to the output node and a second terminal connected to a fixed voltage potential.

The amplifier of the present invention includes up to three feedback loops. A first voltage feedback loop comprises a voltage feedback stage having an input connected to a voltage divider driven from the first terminal of the load and an output connected to a feedback input node in the voltage feedback amplifier stage. A second voltage feedback loop comprises a voltage feedback stage having an input connected to the first terminal of the load and an output connected to a feedback input node in the push-pull voltage gain/phase splitter stage. A third feedback loop comprises a current feedback stage having an input in series between the output node and the load and an output connected to a feedback input node in the voltage feedback amplifier stage. The current feedback connection works in conjunction with input stage to lower distortion and provide a relatively flat frequency response.

Current sharing of MOS output devices is made possible by the circuit configuration comprising an operational amplifier in the output stage. Inherent current limiting is provided due to resistor strings used to bias the inputs of the operational amplifier in the output stage. These resistor strings provide numerous possible modulation nodes.

The amplifier of the present invention has a high degree of temperature stability due to employment of temperature stable references in the biasing network of the operational amplifier in the output stage and in the voltage gain/phase splitter stage. The configuration of the input stage lowers the damping factor of the amplifier of the present invention.

BRIEF DESCRIPTION OF THE DRAWING FIGURES

Figure 3A:
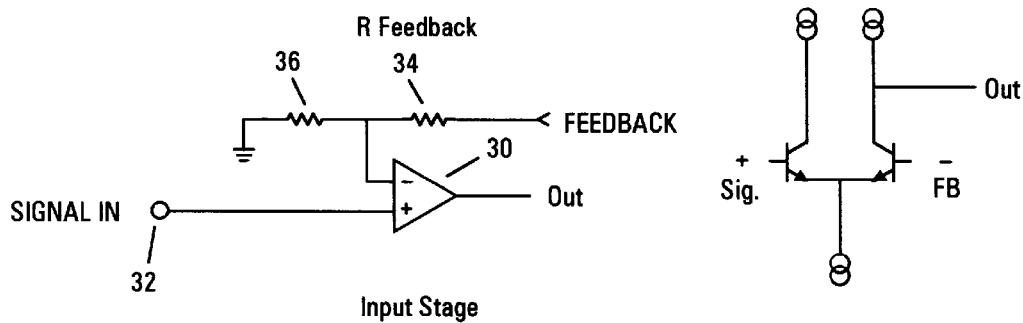
Figure 3B:
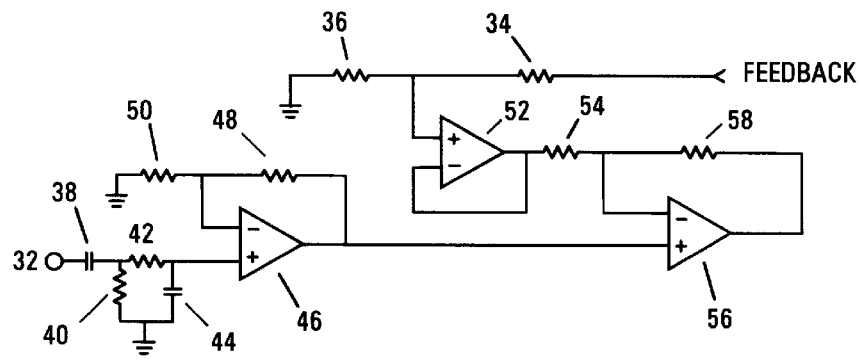
Figure 3C:
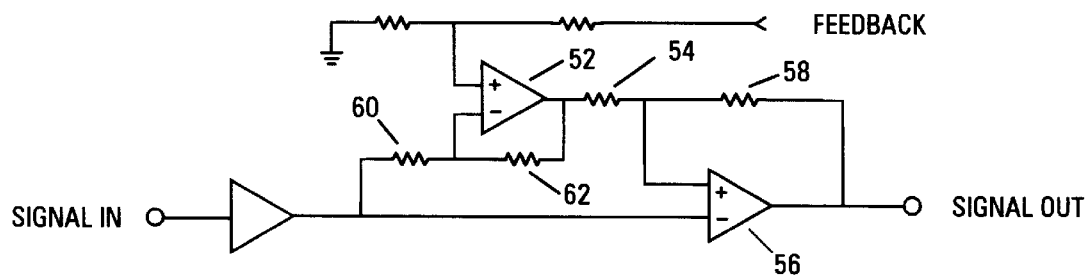

FIGS. 3a, 3b, and 3c, are schematic diagrams of alternate embodiments of a voltage feedback amplifier stage suitable for use in the present invention.

Figure 4:
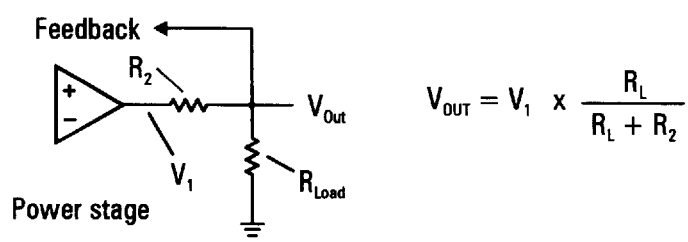

FIG. 4 is a schematic diagram illustrating the voltage divider formed by the output impedance as a small resistance in series with the load resistance.

Figure 5:
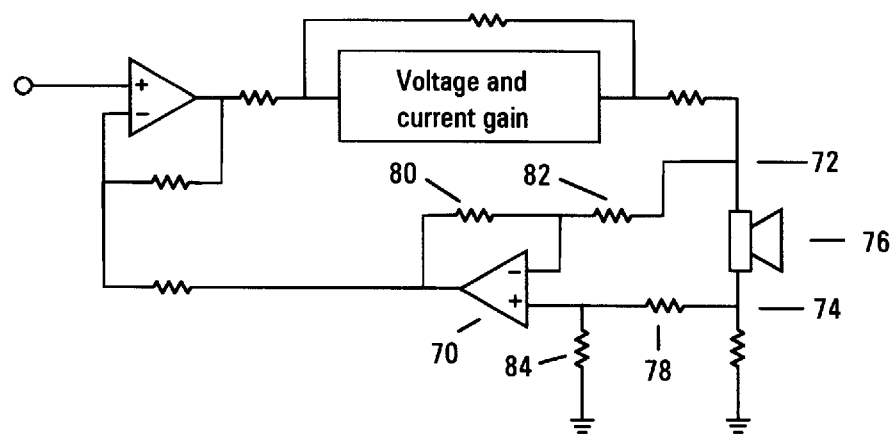

FIG. 5 is a schematic diagram of a feedback loop employing a differential sensing amplifier.

Figure 6:
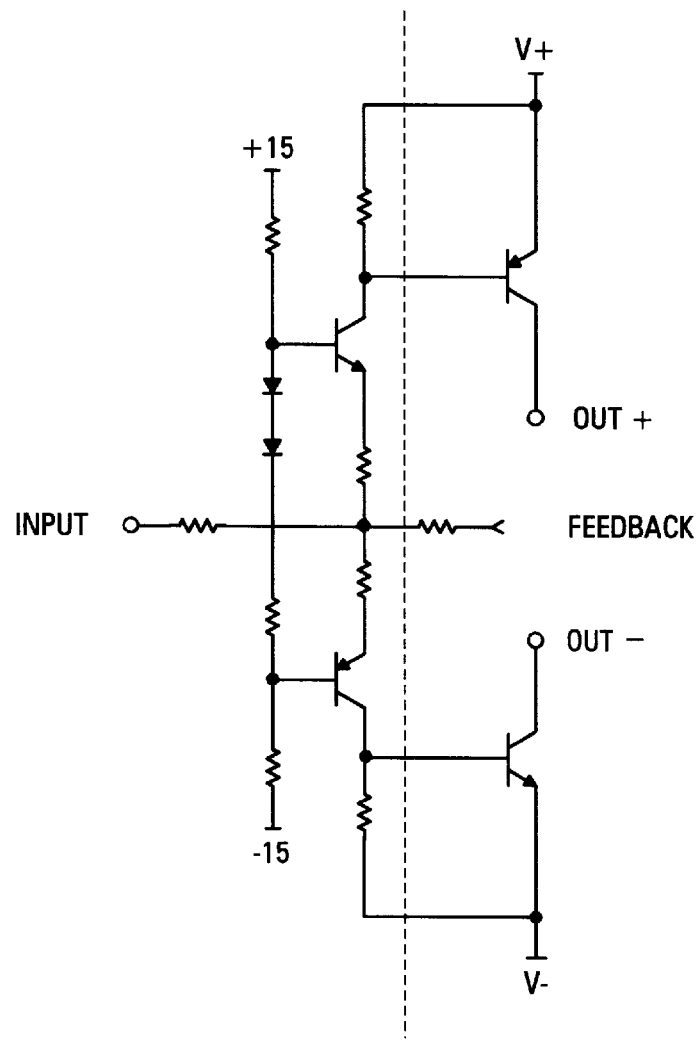

FIG. 6 is a schematic diagram of a bipolar voltage gain/phase splitter stage, suitable for use in the present invention.

Figure 7A:
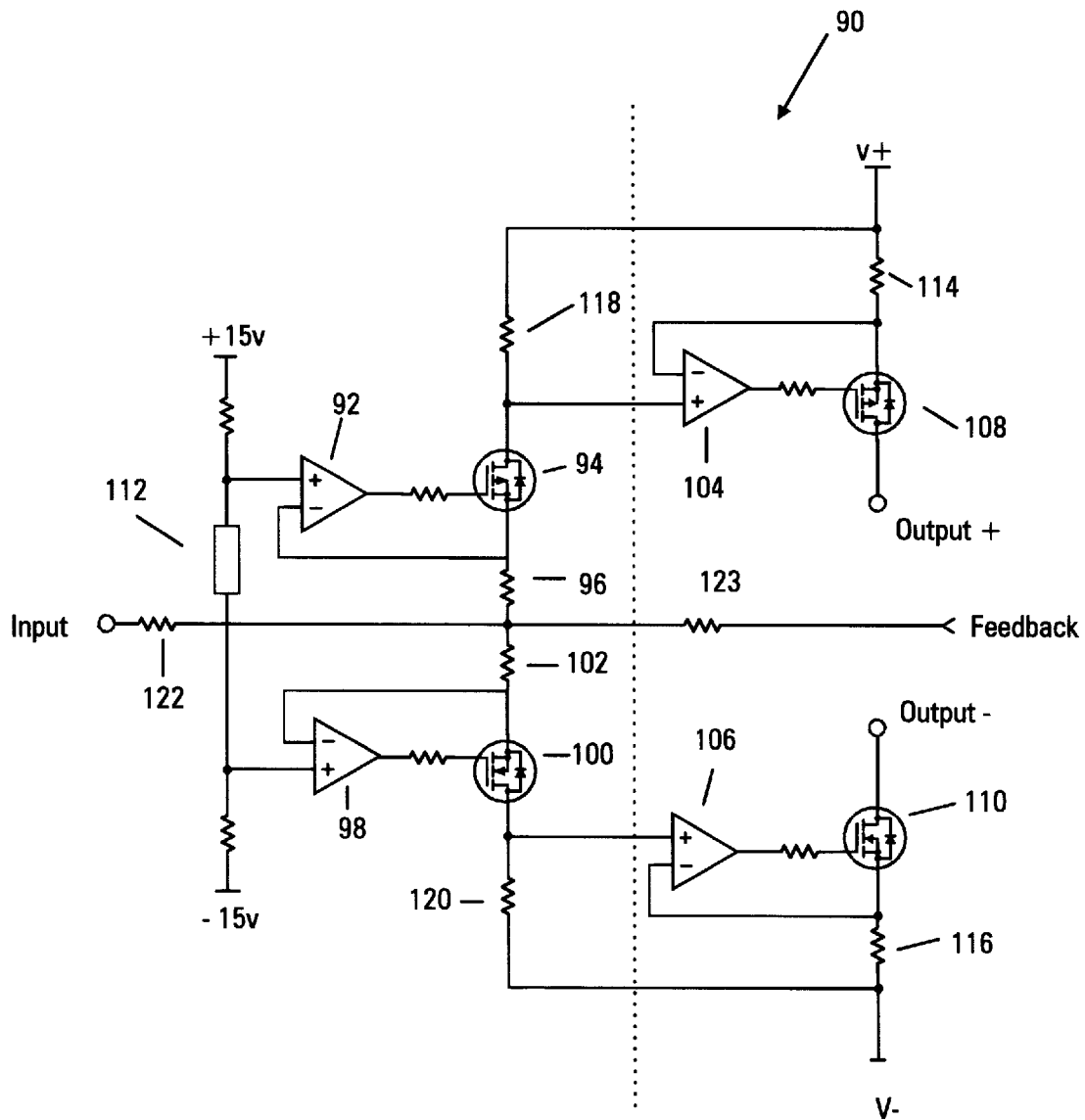

FIG. 7a is a schematic diagram of a MOSFET voltage gain/phase splitter stage, suitable for use in the present invention.

Figure 7B:
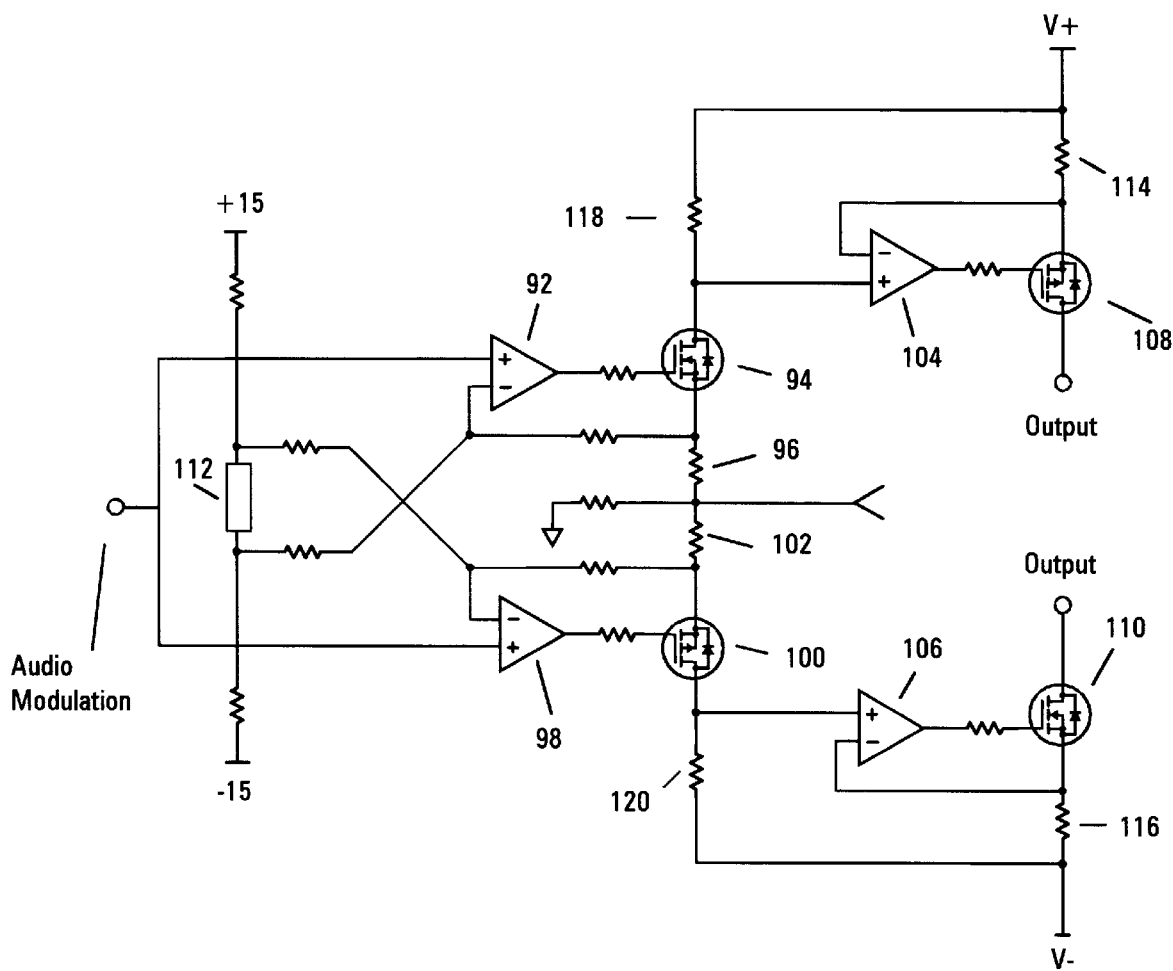

FIG. 7b is a schematic diagram of an alternate MOSFET voltage gain/phase splitter stage suitable for use in the present invention.

Figure 2:
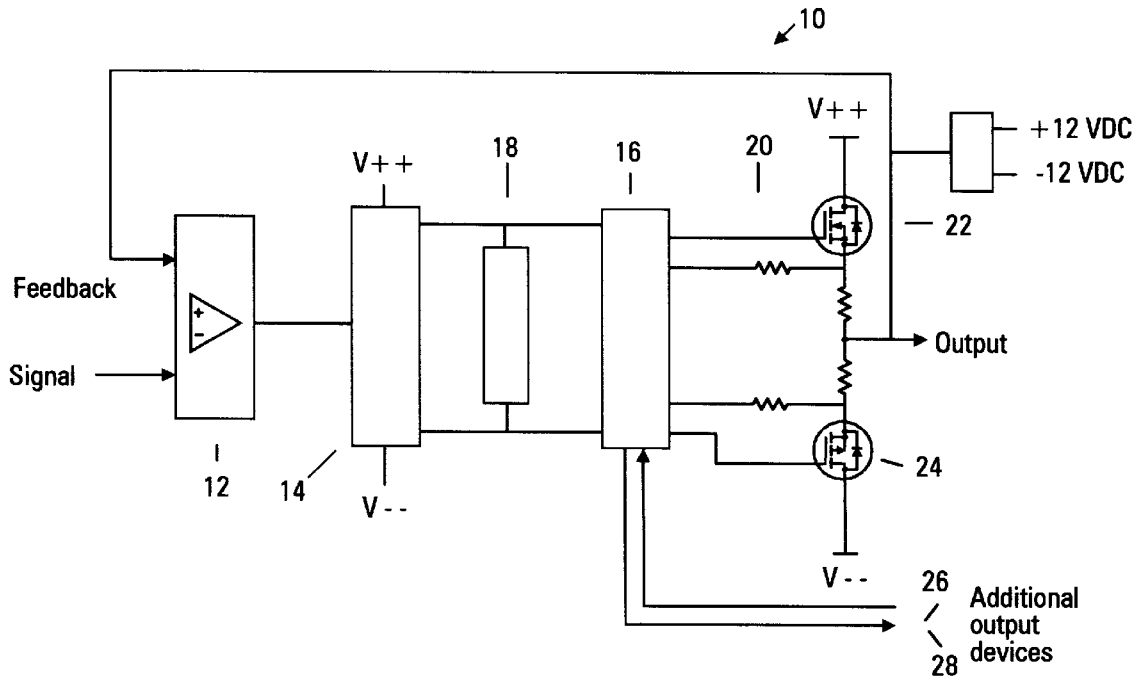
FIG. 2 is a block diagram of a MOSFET output audio power amplifier according to a presently preferred embodiment of the invention.
Figure 8:
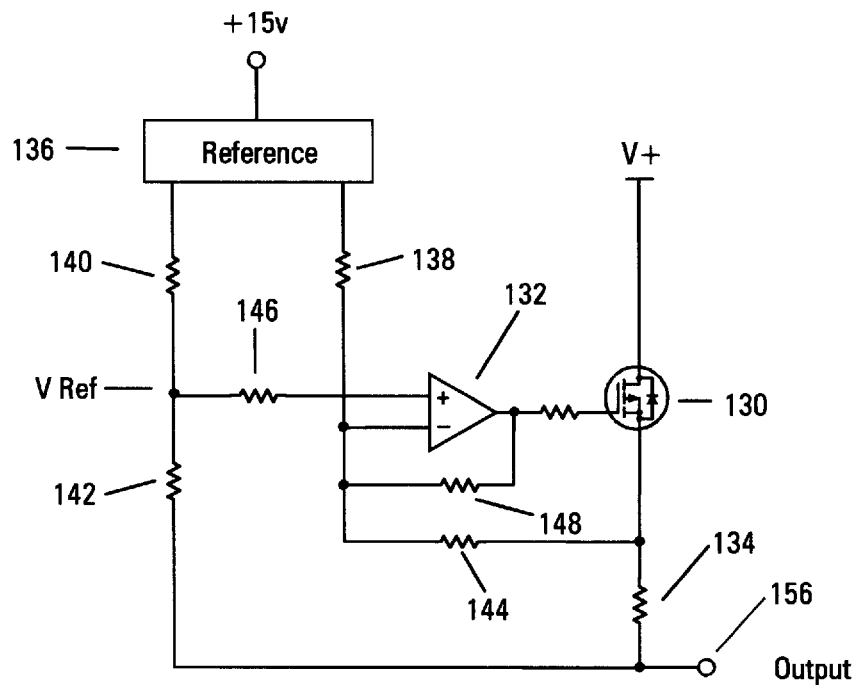

FIG. 8 is a schematic diagram of the positive half of an output, or current gain stage for use in the amplifier of FIG. 2.

FIGS. 9 through 15 are schematic diagrams illustrating numerous ways to introduce audio modulating voltage inputs to the current gain stage circuit of FIG. 8.

Figure 16:
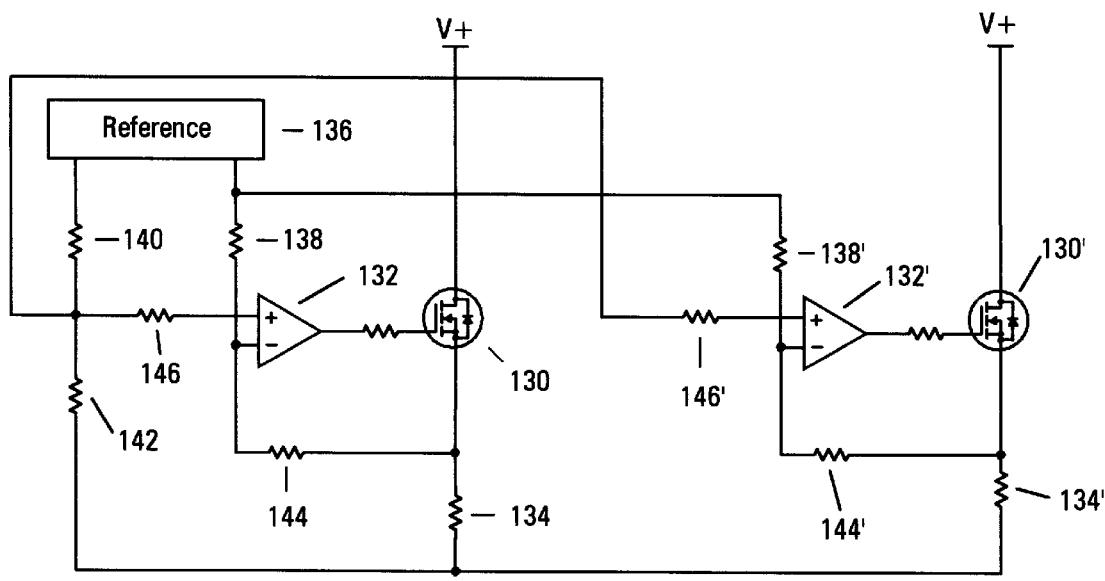

FIG. 16 is a schematic diagram illustrating the driving of multiple MOSFET transistors connected in parallel, including the components that must be duplicated and those that are shared by all sections of the circuit.

Figure 17:
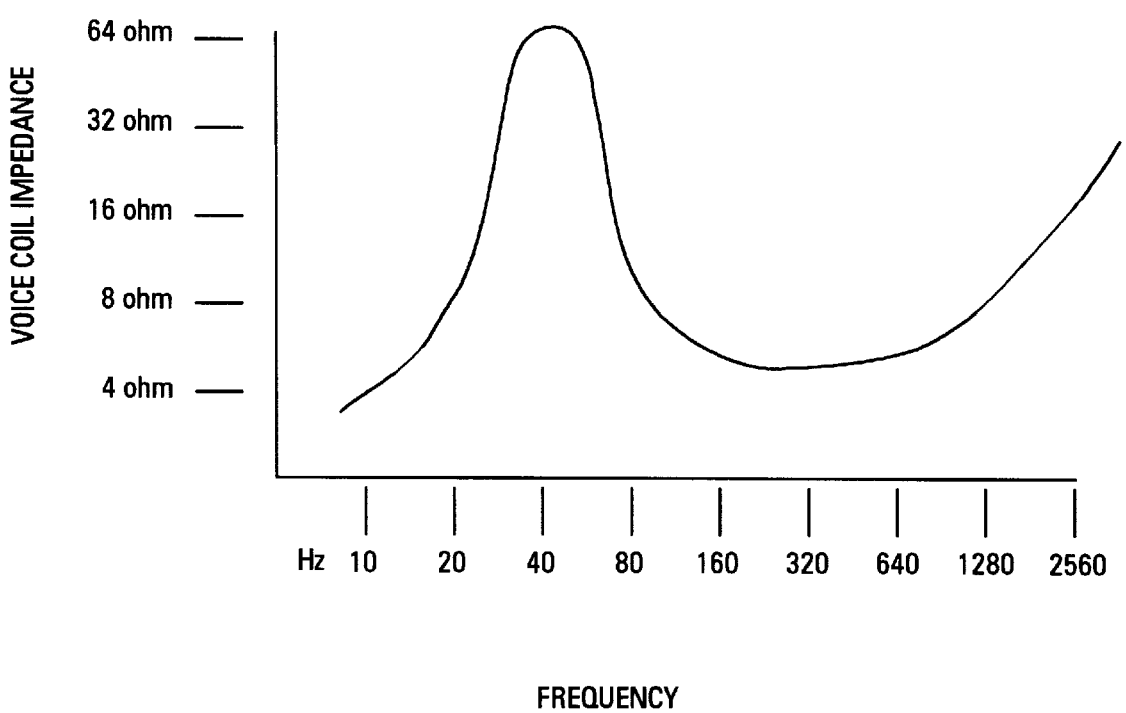

FIG. 17 is a graph showing speaker voice coil impedance vs. frequency for typical loudspeakers as measured in free air for a typical amplifier circuit employing current feedback techniques.

Figure 18:
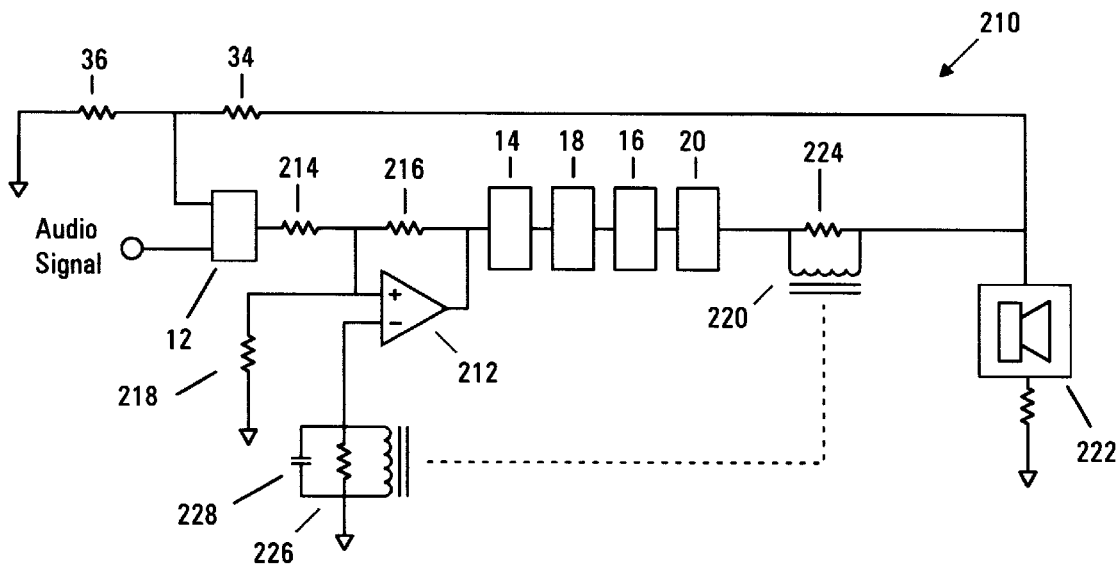

FIG. 18 is a schematic diagram of an audio amplifier according to the present invention employing a circuit for developing a voltage which may be applied to a current feedback amplifier.

Figure 19A:
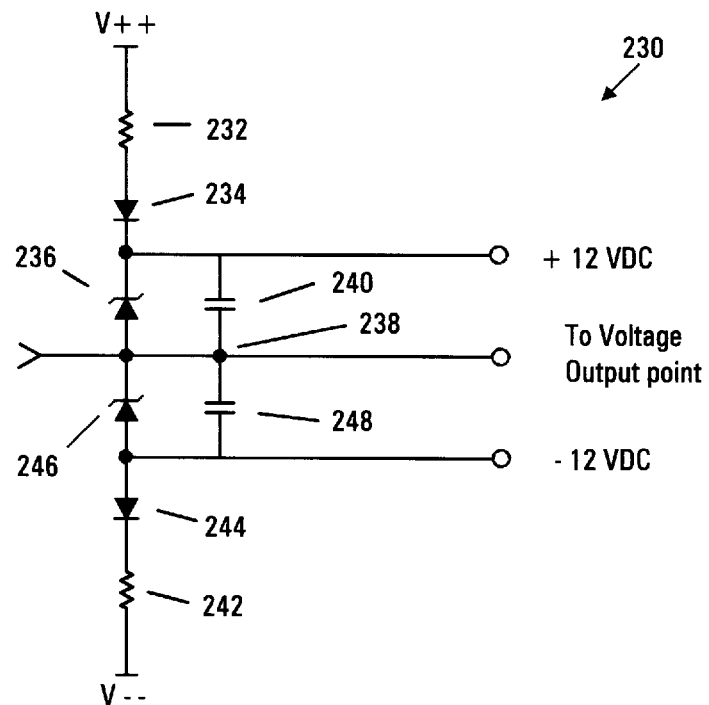
Figure 19B:
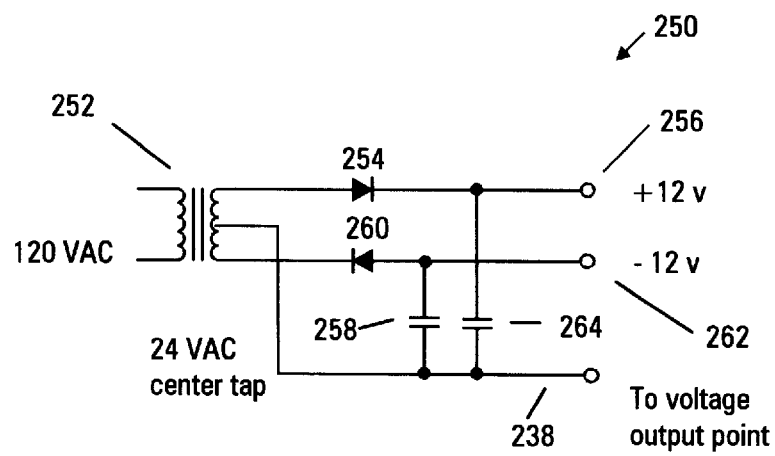

FIGS. 19a and 19b are schematic diagrams illustrating circuits for supplying bias voltages to the amplifier circuits disclosed herein.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

In the disclosure presented herein, MOSFET devices disclosed herein include at least single transistor devices, such as MTP 12 N 20, MTP 12 P 20, available from sources such as Motorola Semiconductor of Phoenix Ariz., and single or multiple transistor functional equivalents thereof, whether now known or unknown.

Figure 1:
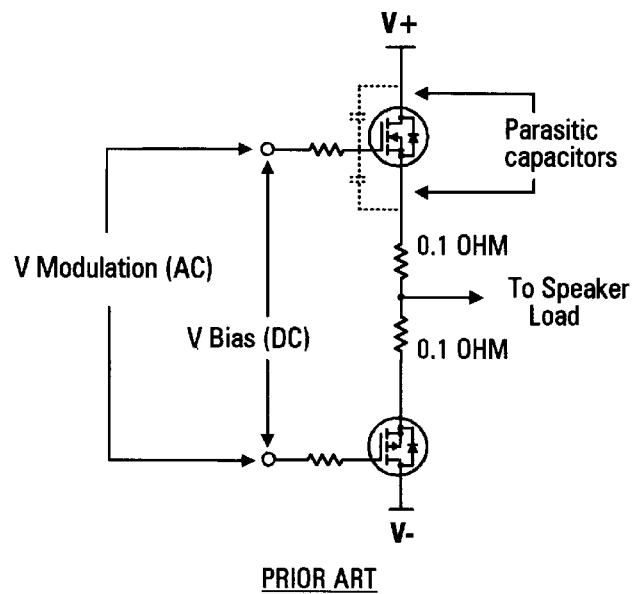
FIG. 1 is a schematic diagram of a typical output stage of a MOSFET audio amplifier.

FIG. 1 is a schematic diagram which shows a typical prior-art output stage of a MOSFET audio power amplifier. The amplifier of FIG. 1 suffers from the aforementioned drawbacks relating to transistor matching problems.

Referring now to FIG. 2, a diagram of an amplifier 10 is presented which can employ MOSFET transistors in the voltage gain and current gain stages. The amplifier 10 of FIG. 2 employs unique modulating techniques disclosed herein which allow stable and easily adjusted quiescent biasing.

The first stage of amplifier 10 comprises a voltage feedback amplifier 12. The output of voltage feedback amplifier 12 is presented to voltage gain/phase splitter stage 14. Voltage gain/phase splitter stage 14 drives current drive stage 16 through bias adjustment stage 18. Current drive stage 16 drives an output stage 20 comprising paralleled individual output devices. Four individual MOSFET output devices 22, 24, 26, and 28 are shown in FIG. 2, but persons of ordinary skill in the art will recognize that the amplifier 10 of the present invention may employ larger numbers of paralleled output devices.

Referring now to FIGS. 3a, 3b, and 3c, alternate embodiments of voltage feedback amplifier stage 12 are shown in schematic diagram form. Turning first to FIG. 3a, the voltage feedback amplifier stage 12 illustrated therein is formed around operational amplifier 30. Operational amplifier 30 may be one of many commonly used operational amplifier circuits, but low noise operational amplifiers, such as the NE5532 operational amplifier available from Signetics of Sunnyvale, Calif., may be advantageously employed in the present invention.

When the voltage feedback amplifier of FIG. 3a is employed in the present invention, the audio input to amplifier 10 of the present invention is provided to input node 32, connected to the non-inverting input of operational amplifier 30. The inverting input to operational amplifier 30 is connected to the output of a voltage divider comprising feedback resistor 34 and shunt resistor 36. The values of feedback resistor 34 and shunt resistor 36 are chosen such that the gain of the amplifier 10 is between about 10 and about 50.

Referring now to FIG. 3b, a schematic diagram of a presently preferred voltage feedback amplifier for use in the present invention is shown. Audio input node 32 of amplifier 10 is AC coupled through a well-known high-pass network including coupling capacitor 38 which may have a value of, for example 10 $\mu$F, and resistor 40, which may have a value of for example about 10–20 K$\Omega$. Using these values for capacitor 38 and resistor 40 results in a low-end frequency response of about 10 Hz for the amplifier 10.

A low-pass filter comprising series resistor 42 and shunt capacitor 44 suppresses parasitic RF oscillation of amplifier 10 caused by stray radio frequency detection. The typical cutoff frequency of the low pass filter is about 40 KHz and typical values for the low-pass filter are 2 K$\Omega$ for resistor 42 and 1000 pF for shunt capacitor 44.

The output of the low-pass filter is presented to the non-inverting input of operational amplifier 46. The inverting input of operational amplifier 46 is fed through feedback resistor 48 and bias resistor 50. Feedback resistor 48 is preferably a variable resistor, such as a trimpot, to allow setting of the gain structure of the operational amplifier 46.

In the embodiment of FIG. 3b, the output of the voltage divider comprising feedback resistor 34 and shunt resistor 36 is presented to operational amplifier 52, configured as a well-known source follower. A third operational amplifier 56 has its non-inverting input fed from the output of operational amplifier 46 and its inverting input fed from the output of source follower amplifier 52, through resistor 54. Feedback resistor 58 sets the gain of operational amplifier 56, preferably from about 10 to about 100.

FIG. 3c is a schematic diagram of an alternate embodiment of a voltage feedback amplifier which may be employed in the present invention. From an examination of FIG. 3c, those of ordinary skill in the art will recognize that the source follower configuration of operational amplifier 46 has been replaced by a negative feedback configuration which provides additional gain to the feedback signal through the use of resistors 60 and 62. As presently preferred, the gain of operational amplifier 52 of FIG. 3c is set to about 10 by choosing the values of resistors 60 and 62 to be, for example, about 1 K$\Omega$ and 10 K$\Omega$ respectively. Persons of ordinary skill in the art will recognize that different gain structures may be employed as warranted for different applications.

The voltage feedback amplifier stage 12 of the amplifier 10 of FIG. 2 provides moderate gains to the input signal while applying large amounts of gain to the error component of the feedback signal. This has the effect of raising the output damping factor. The current sense resistors, to be described later as part of the output stage biasing and current control circuitry, have the disadvantage that they can degrade the damping factor of the amplifier.

Damping factor is defined as the inverse of output impedance. (Damping factor=1/Z out) Further, in cases where a current feedback system is utilized in the power amplifier, damping factor is grossly degraded by the sense resistors normally found in this type of circuit. For example, the typical sense resistor used in output stages employing current feedback designs has a value of 0.1 ohm. This component is essentially placed in series with the power amplifier output, with the result that the best case damping factor cannot be greater than 10 (1/0.1=10). This is considered to be quite poor for high quality audio equipment.

It is generally understood that feedback lowers the output impedance of an audio amplifier. This is a function of a feedback voltage being introduced to the input stage of the multi-stage amplifier. Traditional feedback does lower output impedance considerably, but is far from fully effective. This is evidenced by the fact that there appear to be no audio amplifiers in existence with damping factors approaching infinity, (corresponding to an ideal output impedance of zero), which would be the case if traditional voltage feedback were fully effective. Therefore, it is possible to conclude that traditional feedback is not sufficient to completely remove voltage errors from the power amplifier output.

Output impedance can be characterized as a small resistance in series with the load resistance. In this sense, a voltage divider is formed, as illustrated in FIG. 4. The output voltage of the amplifier may be considered as having been attenuated by this divider. Therefore, the magnitude of amplifier output impedance can be represented as a voltage error which can be fed back to an error amplifier and divided by the gain of that amplifier. In traditional connections, gain is applied to the error signal, but gain is also concurrently applied to the input signal as well. This is because the open loop gain of the error amplifier is applied to both the input signal and the error signal.

In prior-art circuits, the feedback loop is closed to the output of the power amplifier, as in FIG. 3a. In FIG. 3b, a connection is shown that applies additional gain to the error signal while maintaining unity gain for the input signal. In the arrangement shown in FIG. 3b, the error amplifier has a closed loop gain of unity for the input signal since resistor 54 does not transmit current to the inverting input of operational amplifier 56. This is because the output of operational amplifier 52 is driven with much the same voltage as the input signal applied to the non-inverting input of amplifier 56.

At the same time, error components of the feedback signal, which can be considered as small variations superimposed on a replica of the input signal, will appear at the output of operational amplifier 52 of FIG. 3b, are amplified with a gain of $(-R34/R36) \times$ Verror. Resistors 34 and 36 are chosen such that the voltage divider divides the output voltage by the same ratio as the gain applied by amplifier 14 of FIG. 2. This additional gain, which is applied only to the error signal in the feedback loop, results in additional lowering of the output impedance of the power amplifier. Even greater gains may be applied with the addition of the connection shown in FIG. 3c. This circuit compares the input voltage to the error voltage in two different stages and can apply a potential gain to the error signal that is many times greater than can be applied by a traditional error amplifier.

Referring now to FIG. 5, in the case of a system using a current sense resistor, or in systems employing long speaker leads which themselves appear as complex impedances with resistance, inductance and capacitance, and also introduce errors, a differential sensing amplifier 70 may be employed for feedback with good results.

In the mode illustrated in FIG. 5, separate leads 72 and 74 would be provided to detect the error voltage remotely at the input terminals to the speaker system 76, as in the traditional remote sense arrangements employed widely in applying DC power supplies. Operational amplifier 70 is employed as a differential feedback signal amplifier, having a gain selected by resistors 78, 80, 82, and 84. The arrangement shown in FIG. 5 reduces audible distortion in systems that employ long speaker leads such as in large concert sound installations or distributed sound systems in large buildings. Those of ordinary skill in the art will recognize that a phase inversion may be implemented in this stage by exchanging the connections of resistors 78 and 82.

A bipolar voltage gain/phase splitter stage, such as shown in FIG. 6, is well suited to be used with the new circuits shown here. Circuitry such as is depicted in FIG. 6 has long been in use and is well understood in the art. Explanation of the details of the operation of such circuitry is omitted herein in order to avoid unnecessarily obfuscating the disclosure of the present invention.

A schematic diagram of a MOSFET analogy of the bipolar voltage gain/phase splitter stage circuit of FIG. 6 is shown in FIG. 7a. The voltage gain/phase splitter stage circuit 90 of FIG. 7a includes active biasing to promote stability as well as high speed. In the positive (top) half of the MOSFET voltage gain/phase splitter stage embodiment shown in FIG. 7a, an operational amplifier 92 drives a MOSFET 94 to compare the voltage across resistor 96 with a reference voltage. In the negative (bottom) half of the MOSFET voltage gain/phase splitter stage embodiment shown in FIG. 7a, an operational amplifier 98 drives a MOSFET 100 to compare the voltage across resistor 102 with the reference voltage. In each case, operational amplifiers (respectively shown at reference numerals 104 and 106), drive MOSFET devices (respectively shown at reference numerals 108 and 110).

A temperature stable reference 112 is preferably employed as reference voltage source to guarantee that the currents in all devices will remain constant, as disclosed herein. An example of such an adjustable temperature-stable reference which may be employed in the present invention is LM385Z, available from National Semiconductor of Santa Clara, Calif.

The supply voltage applied to the source resistors 114 and 116 may be set to between about ±40 V and about ±80 V, while the supply voltage applied to operational amplifiers 92 and 98 may be between about ±10 V and about ±15 V. Those of ordinary skill in the art will recognize that the supply voltage applied to the source resistors 114 and 116 will determine the maximum power output obtainable from amplifier 10.

Persons of ordinary skill in the art will recognize that the circuits of FIGS. 5 and 6 may also be partially combined, employing the common-base input bipolar transistors of FIG. 6 with the MOSFET transistors 108 and 110 to the right of the dashed line of FIG. 7a. Such skilled persons will also appreciate the presence of series resistors driving the gates of MOSFET devices 94, 100, 108, and 110 and will set the values of these resistors in order to damp potential oscillations of MOSFETS 94, 100, 108, and 110 by introducing an RC frequency pole at the gates of the MOSFETS. Typical values for these resistors are in the range of about 100 Ω to about 1 KΩ.

As an alternative, the MOSFET bias provided in this stage by operational amplifiers 92 and 98, may be generated with the diode string of FIG. 6 in series with a resistor as shown in FIG. 6.

In the embodiment depicted in FIG. 6, the diodes, which may be 1N4001 signal diodes, available from many sources, will typically exhibit a temperature coefficient of 3000 ppm per °C., while the resistors in the resistor string are considered to be relatively stable, (typically 50 ppm). The temperature-sensitive voltage drop of the diode string represents a certain percentage of the total gate bias voltage, as developed by the resistor string and typical ±15 volt system voltage supply sources. With appropriate component selection, an example of which is R=(1 to 2 volts)×Ibias, the present invention contemplates that a bias voltage can be generated that closely emulates the temperature sensitivity of the MOSFET threshold voltage, which is typically in the range of 1000 to 1500 ppm/degree C.

The operational amplifier 92 will cause the MOSFET 94 to drive current into the resistor 96 until the two voltages across the inverting and non-inverting inputs of operational amplifier 92 are equal, and then stabilize. The current in the transistor 94 is therefore defined and stabilized. The resulting voltage across source resistor 118 is also fully defined by the same current and the selected value of the resistor 96. The same holds true for the operation of the negative half of the circuit.

The current in transistor 108 is therefore also fully defined by the voltages across source resistors 114 and 118 and their counterparts 116 and 120. Since the voltage across resistors 114 and 118 and their counterparts 116 and 120 are temperature stable due to the action of the stable reference, the current in transistor 108 is stabilized. The circuit is modulated by driving a voltage from the output of the preceding stage into the inverting input of the circuit of FIG. 7a at resistor 122. A voltage feedback loop from the output node of the output (current gain) stage is provided through resistor 123. The ratio of the values of resistor 123 to resistor 122 is on the order of from about 10:1 to about 50:1. In an actual embodiment of the present invention resistor 122 was selected to be 1.5 KΩ and resistor 123 was selected to be 39 KΩ.

FIG. 7b is a schematic diagram of an alternate MOSFET voltage gain/phase splitter stage suitable for use in the present invention. In the circuit of FIG. 7b, the modulating voltage is driven into the non-inverting inputs of the operational amplifiers 92 and 98, while the reference is applied through the inverting inputs of the operational amplifiers 92 and 98. Those of ordinary skill in the art will recognize that this arrangement causes the overall circuit to become non-inverting.

In the embodiment of FIG. 7b, the operational amplifier 92 driving MOSFET 94 compares the voltage across resistor 96 with the reference voltage. The operational amplifier 92 will cause the MOSFET 94 to drive current into the resistor 96 until the voltages at the inverting input and non-inverting input of operational amplifier 92 are equal, at which time the circuit will stabilize. The current in the MOSFET transistor 94 is therefore defined and stabilized. The resulting voltage across source resistor 118 is also fully defined by the same current and the selected value of the resistor 96. The negative half of the circuit operates in the same manner as just described for the positive half.

The current in MOSFET transistor 108 is therefore also fully defined by the voltages across resistors 114 and 118. Since the voltage across resistor 118 is temperature stable due to the action of the stable reference, the current in transistor 108 is stabilized. The modulating voltage is driven into the non-inverting inputs of the operational amplifiers 92 and 98, while the reference voltage is applied through the inverting inputs of the operational amplifiers 92 and 98. This connection allows the overall circuit to become non-inverting.

Referring now to FIG. 8, a schematic diagram of the positive half of an output, or current gain stage 16 of the amplifier 10 of FIG. 2 is presented. FIG. 8 illustrates the basic circuit and quiescent biasing technique without the additional circuitry required to modulate the output current.

MOSFET transistor 130 is connected in a feedback loop with operational amplifier 132. The circuit is arranged so that the operational amplifier 132 drives the gate of the transistor 130 with a voltage, which causes current to flow in the transistor. Resistor 134 converts the resulting current to a voltage, which is fed to the inverting input of operational amplifier 132. A stable reference voltage derived from a reference source 136, such as an LM385 2.5 integrated circuit, is applied to the non-inverting input of operational amplifier 132 using an appropriate resistor network as in the connection shown. More specifically, the resistor network comprises resistors 138, 140, 142, and 144, which serve to divide the reference voltage and allow for adjustment to a slightly different value for each input of the operational amplifier 132 in order to establish a nominal quiescent current flow in the output transistors, typically in the range of from about 20 mA to about 30 mA. Resistor 146 is used to limit input current to the non-inverting input of operational amplifier 132, and to provide a voltage compliant node which is isolated to some degree from the reference divider formed by resistors 138 and 140.

Resistor 148 serves to control the effective open loop gain of the overall feedback loop of operational amplifier 132, which includes the extremely high impedance gate/source path of MOSFET 130. This connection may contribute to stability with certain operational amplifiers. Similarly, a small value capacitor of about 1,000 pF may be used in parallel with, or in place of, resistor 148. A diode with its anode at the inverting input and its cathode at the output of operational amplifier 132 may also be used to limit the negative-going voltage swing of operational amplifier 132. These techniques are all known to those of ordinary skill in the art and may be applied as needed to control the behavior of the circuit during turn on and turn off transitions.

Under quiescent conditions, the current flowing in the output MOSFET transistor 130 is determined by the operational amplifier 132, which compares the voltage in the output sense resistor 134 with the voltage from the stable references. When the two inputs of operational amplifier 132 are at the same voltage, the circuit is in a stable state.

Initially, there is no current flowing in the MOSFET transistor 130. This causes the inverting input of the operational amplifier 132 to be at a lower voltage than its non-inverting input because there is no current flowing in the sense resistor 134, and therefore no voltage is being generated as a result. The values of resistors 138, 140, 142, and 144 are selected to ensure this initial condition, or some form of adjustment may be provided to create it, such as a variable resistor string placed between the two nodes in the resistor divider biasing the non-inverting inputs of operational amplifier 132 and its counterpart in the negative half of the output stage. When the required condition of voltages exists, the operational amplifier 132 will cause its output to slew in the positive direction, driving a positive voltage to the gate of the power MOSFET transistor 130, commanding current to flow.

As current flows, the voltage developed across the sense resistor 134 is applied to the inverting input of the operational amplifier 132 through an appropriate resistor network, typically having a voltage division of about one half. As this voltage approaches the magnitude of the voltage applied to the non-inverting input, the output voltage of operational amplifier 132 stabilizes, thereby causing the current in the MOSFET transistor 130 to stabilize. As this takes place, the voltage across the sense resistor 134, which is fed back to the operational amplifier 132, will in turn stabilize and the circuit will remain in a stable, quiescent condition until some modulation is applied to one of the voltages applied to either of the inputs to operational amplifier 132, with such modulation being made possible by the presence of the resistor strings.

Temperature stability of current flow in the circuit is assured because current in the MOSFET transistor 130 is represented by a voltage across the sense resistor 134, which is in turn compared to a stable reference voltage derived from voltage reference 136. In the case where multiple MOSFET output transistors are placed in parallel, they would each be provided with a sense resistor, and the separate voltages compared in separate operational amplifiers, but since they are all referenced to the same stable voltage, each MOSFET output transistor is will be commanded to drive currents that will match to within a few percent of each other, and which would be dependent on the tolerances of the components used. Since 1% tolerance resistors are in common use, the circuit can have 1% matching of the currents in paralleled MOSFET output transistors simply by building it with readily available parts.

Once the connection and quiescent condition described is established, the current in the MOSFET output transistor is modulated by applying an appropriate voltage, typically an audio waveform, to one of the resistor strings connected to one of the inputs of operational amplifier 132. Therefore, it is possible to drive the current for conditions when large currents must be driven into an audio load.

Introducing a modulating signal in order to drive an audio signal power output can be done in several ways. Illustrative ones of those ways are depicted in FIGS. 9 through 16, to which attention is now drawn.

Figure 9:
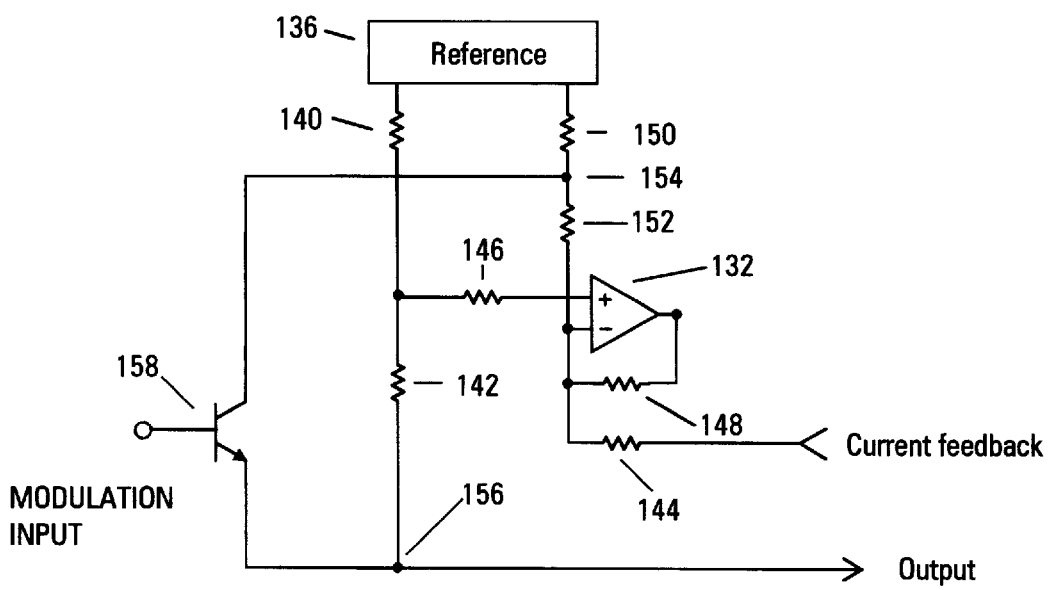

Referring first to FIG. 9, which comprises the leftmost portion of the circuit shown in FIG. 8, the resistance of resistor 138 of FIG. 8 may be divided into two component resistors 150 and 152, thus creating a point 154 that can be modulated with a voltage. A small signal common emitter NPN bipolar transistor 158, having its base connected to a source of a modulating signal, its emitter connected to the output node 156, and its collector connected to point 154 will modulate the feedback voltage from resistor 144, causing the operational amplifier 132 to command current flow in the MOSFET output transistor 130 of FIG. 8. This in turn will cause a voltage slewing condition of the output node 156. The bipolar transistors in this connection may be biased to a partially conducting state using traditional techniques in order to emulate the action of a traditional bi-polar class AB output stage.

The circuit of FIG. 9 has the disadvantage that current gain is inherent in the bipolar transistor 158. This gain can be quite high, and is also non-linear, being exponential over several decades of collector current, as is well understood in the art. This will generate a non-linear modulating signal which can introduce voltage gain into this stage of the power amplifier creating a condition which is un-desirable for circuit stability.

Figure 10:
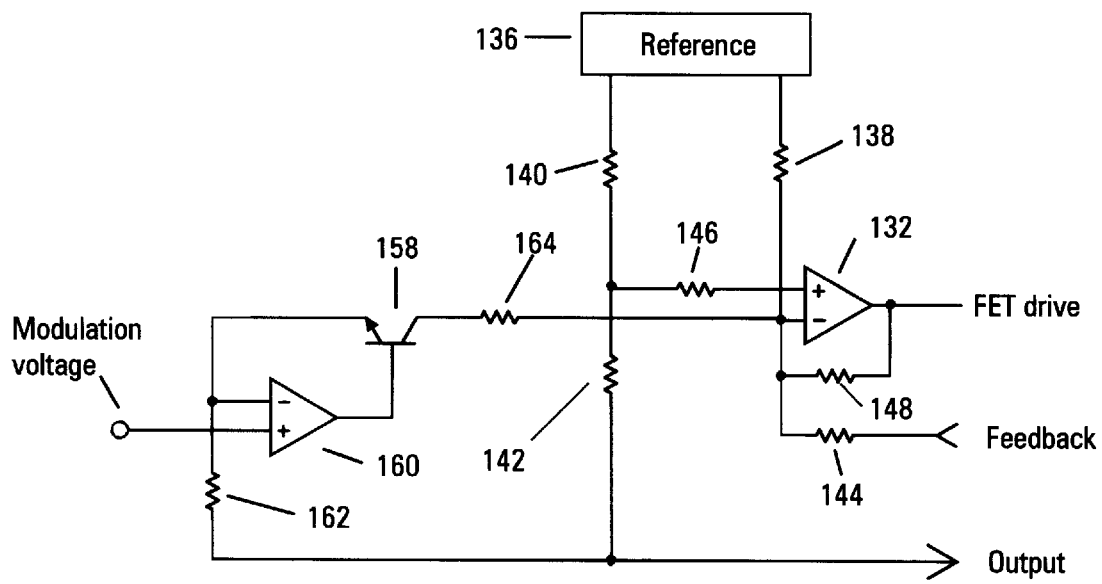

Referring now to FIG. 10 a circuit is shown wherein the bipolar transistor 158 is placed in the feedback loop of an operational amplifier 160. In this connection, the collector current is forced to become a linear analogy of the voltage across resistor 162. Resistor 164 provides a compliant connection in the event that bipolar transistor 158 becomes saturated.

This circuit avoids the condition of voltage gain in the output stage of the amplifier, since the voltage changes in the resistor network biasing the operational amplifier 160 will also be forced to be linear.

It would be a distinct advantage to have a current limiting function built in to the output stage of the amplifier. To do this, it is necessary only to define the limits of voltage modulation applied to the operational amplifier 160. It is also considered desirable to avoid applying currents or voltages to the inverting input of the operational amplifier 160 other than those resulting from the feedback and reference connections, or to introduce a connection which would vary the impedance seen by the inverting input.

These conditions can be met by applying a modulating voltage only to the resistor network connected to the non-inverting input of the operational amplifier 132 comprising resistors 140 and 142. Further, by defining the minimum and maximum voltage levels applied at the non-inverting input of operational amplifier 132, the minimum and maximum current in each output transistor may be also be fully defined.

Figure 11:
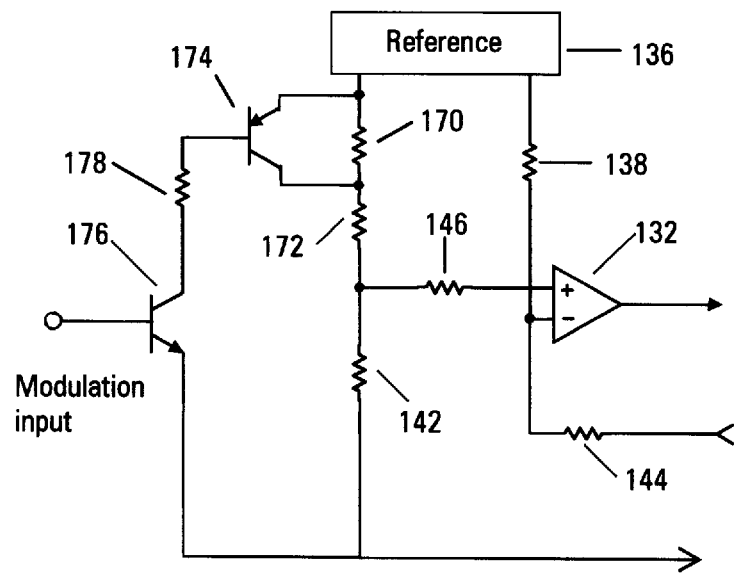

The circuit of FIG. 11 can accomplish this. In the circuit of FIG. 11, resistor 140 has been replaced by series connected resistors 170 and 172. PNP bipolar transistor 174 has its emitter connected to the top of resistor 170 and its collector connected to the bottom of resistor 170. The base of PNP transistor 174 is driven from NPN transistor 176 through its collector resistor 178. The modulating signal is applied to the base of NPN transistor 176.

When both transistors shown are in a non-conducting state, the resistor string 142, 170 and 172 causes the circuit to establish a quiescent operating point. When PNP transistor 174 is fully conducting, resistor 170 is short circuited out of the circuit, and current flows in the output transistor, the magnitude of which is defined by the resulting modulating voltage, which is in turn fully defined by the resistor values in the bias string connected to the non-inverting input through resistor 146.

Figure 12:
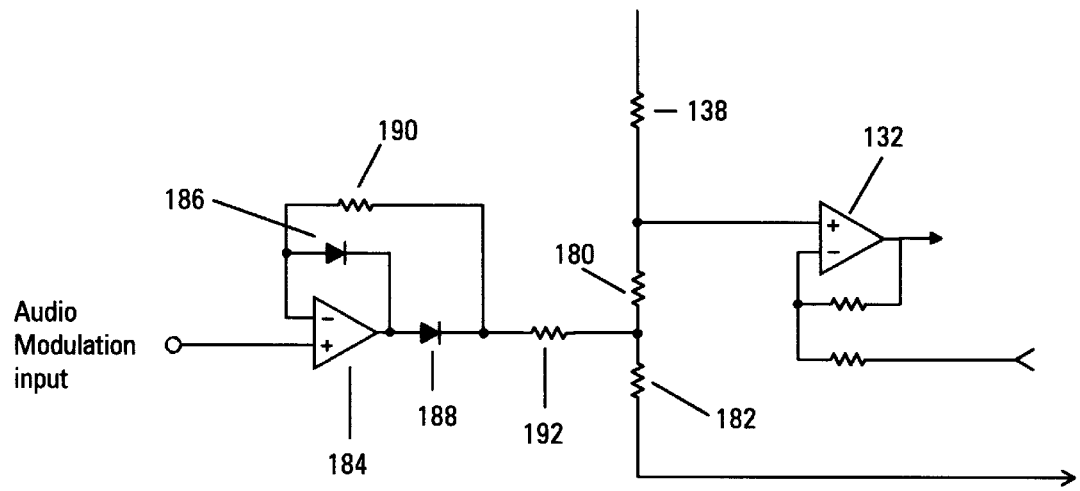

To eliminate the non-linear gain of the bipolar transistors in the circuit of FIG. 11, the circuit of FIG. 12 may be employed. In this embodiment, resistor 140 is replaced by two series connected resistors 180 and 182. An operational amplifier 184 has the audio input signal applied to its non-inverting input. A diode 186 having its anode connected to the output of operational amplifier 184 and its cathode connected to the inverting input of operational amplifier 184. A diode 188 has its cathode connected to the output of operational amplifier 184 and its anode connected to one end of a feedback resistor 190. The other end of feedback resistor 190 is connected to the inverting input of operational amplifier 184. Amplifier 184 is configured as a precision rectifier. This circuit is known in the art to remove the diode forward voltage drop from signal rectifier circuits. In this embodiment, positive going signals are applied to the junction of resistors 180 and 182 and affect the voltage applied to the non-inverting input of operational amplifier 132 through resistor 192. Complementary action occurs during negative voltage swings.

Resistor 190 has a value chosen to be many times larger than the impedance of the divider string comprised of resistor 180 and 182 to minimize the loading of this point. As the circuit drive swings negative, the diodes in the positive half of the circuit become reverse biased, leaving the transistor 130 with only the previously defined quiescent current flowing.

Figure 13:
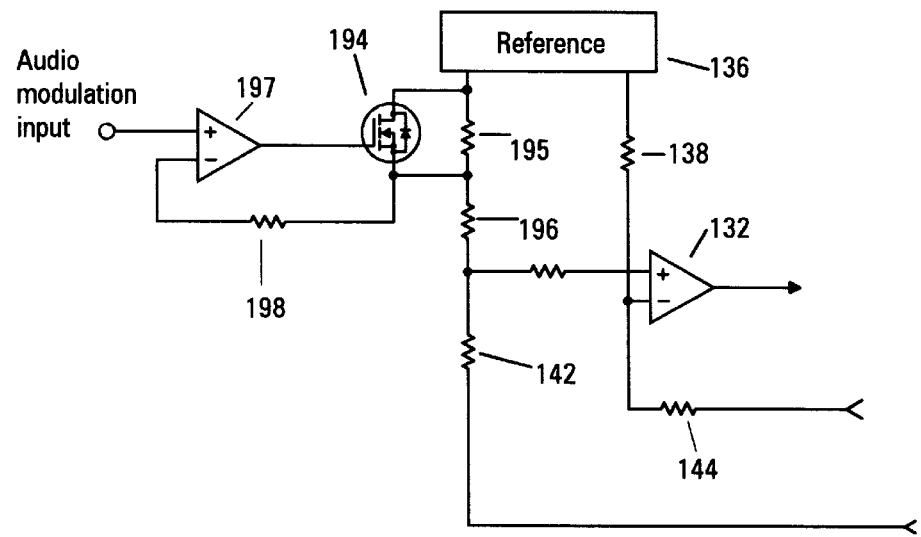

FIG. 13 illustrates a circuit employing a small signal MOSFET 194 as a voltage variable resistor. Resistor 140 is replaced by series connected resistors 195 and 196. The MOSFET 194 shunts resistor 195 in the biasing string connected to the non-inverting input of the operational amplifier 132. An operational amplifier 197 drives MOSFET 194. The audio input signal is applied to the non-inverting input of operational amplifier 197 and a feedback resistor 198, its value chosen to provide sufficient feedback current to operational amplifier 197 to minimize voltage errors due to the amplifier input bias current, is connected between the source of MOSFET 194 and the inverting input of operational amplifier 197.

The circuit of FIG. 13 allows the string to perform its function in the most pure sense, since the MOSFET gate isolation is high enough so that no currents or offsets are injected into the resistor string as a result of leakages or parasitic connections, as is the case with many of the other connections shown. Minimum and maximum currents are defined solely by the resistor values selected, and interference with the operational amplifier operating parameters is avoided. The circuit of FIG. 13 may also be realized with a junction FET of either N-channel or P-channel, or an FET device designed to be used as a variable resistor.

Figure 14:
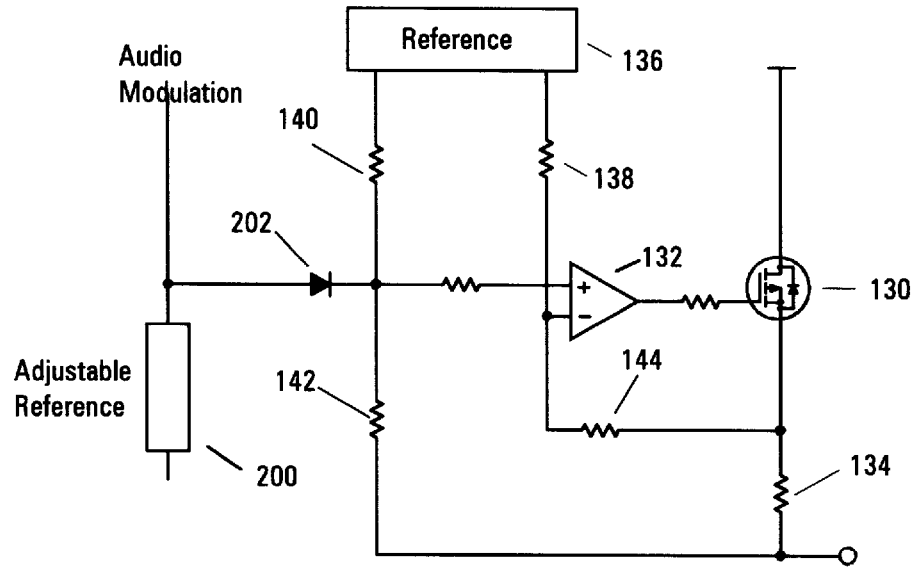

FIG. 14 is a schematic diagram of the positive half of a circuit for applying the audio modulation voltage which requires only one additional reference diode such as the LM385z. The outputs of the circuit of FIG. 7b are connected to the reference diode 200, which is in turn connected to the reference resistive divider string comprising resistors 140 and 142, associated with the non- inverting input of operational amplifier 132 through the signal diode 202. This diode 202 allows the audio driving voltage to disconnect from the reference divider string during excursions of negative drive voltages. This allows the un-driven half of the circuit to be quiescent. The negative half of the circuit is a mirror image of the positive half shown in FIG. 14 and contains a signal diode like 202 having its cathode, rather than its anode, connected to the reference divider resistor string in the negative portion of the circuit.

Figure 15:
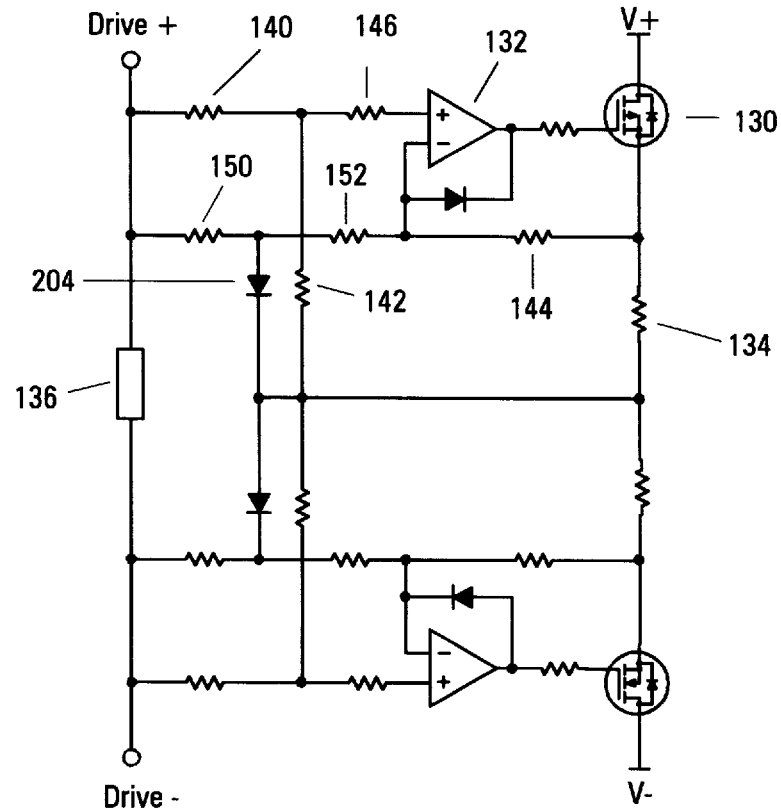

FIG. 15 is a schematic diagram of a simplified circuit that retains the stability of previous circuits yet is economical. The reference diode 136, and the corresponding reference diode in the negative half of the circuit, are both replaced by a single reference diode 136'. Both resistor dividers, comprised of resistors 140 and 142, and 150, 152, and 144 of FIG. 9 are connected to this reference point. This reference voltage is set to be about 2.5 volts.

The stable reference is then modulated by the outputs of FIG. 7b, or 7a. The diode 136' is placed so that as the modulating voltage moves positive, the voltage at the junction of resistor 150 and resistor 152 is clamped to the output reference point, causing the voltage at the non-inverting input of 132 to be offset in the positive direction, thereby causing current to flow in transistor 130, as previously discussed.

In the circuit of FIG. 15, resistor 148 and its counterpart in the negative half of the circuit may both be replaced by a signal diode 204 as shown to clamp the output of amplifier 132. In this connection, the MOSFET transistor in the complimentary half of the circuit is allowed to turn completely off during voltage modulation, as opposed to the other disclosed embodiments which leave the quiescent current flowing during voltage modulation.

FIG. 16 is a schematic diagram illustrating the driving of multiple MOSFET transistors connected in parallel, including the components that must be duplicated, and those that are shared by all sections of the circuit. As may be seen from an examination of FIG. 16, the circuit shown therein is largely a repetition of the circuit of FIG. 8, and is shown driving two MOSFET output devices. A common reference voltage source 136 is used for both MOSFETS, as are resistors 140 and 142. Components which must be duplicated for each MOSFET output device employed are MOSFET 130, operational amplifier 132, and resistors 134, 138, 144, 146, as indicated by MOSFET 130', operational amplifier 132', and resistors 134', 138', 144', 146'.

Current feedback is becoming known to reduce audible distortion in individual loudspeakers. These circuits typically use a small value sense resistor having a value of about 0.1 ohm referenced to ground.

Amplifier circuits employing current feedback stages have a certain disadvantage in that a frequency response curve is imposed on the loudspeaker which is an analogy of the loudspeaker impedance. Such a response curve is illustrated in FIG. 17, a graph showing speaker voice coil impedance vs. frequency for typical loudspeakers as measured in free air. This aspect of current feedback tends to limit the applicability of current feedback to complete systems for which they are primarily designed.

In some cases when it is desirable to avoid having the speakers act as If they are altered, such as when driving a complete speaker system with a crossover network connecting multiple speaker drivers, and which was designed to be used without current feedback, the circuit of FIG. 18 may be usefully employed.

FIG. 18 is a schematic diagram of an audio amplifier 210 according to the present invention including an improved circuit for developing a voltage which may be applied to a current feedback amplifier.

Those of ordinary skill in the art will recognize that the amplifier 210 of FIG. 18 is substantially similar to the circuit earlier described herein with reference to FIG. 2. Elements of the amplifier 210 of FIG. 18 which are the same as corresponding elements of the amplifier 10 of FIG. 2 will be indicated by the same reference numerals as their counterparts in FIG. 2.

As in the amplifier of FIG. 2, the first stage of amplifier 210 comprises a voltage feedback amplifier 12. While in the amplifier 10 of FIG. 2, the output of voltage feedback amplifier 12 is presented to voltage gain/phase splitter stage 14, the output of voltage feedback amplifier 12 of FIG. 18 is presented to a current feedback stage comprising an operational amplifier 212 having its inverting input biased by resistors 214, 216, and 218. Operational amplifier 212 is connected as a current feedback amplifier. Resistor 214 comprises a signal input resistor, resistor 216 comprises a feedback resistor, and resistor 218 a gain setting resistor, which acts only to set the gain of current feedback signals applied to the non inverting input as is known in the art.

Current feedback is supplied to the non-inverting input of operational amplifier 212. Transformer 220 is employed to level translate the feedback signal. The primary of transformer 220 is placed in series with the output of the amplifier 210 and loudspeaker 222 across sense resistor 224. Rather than being connected to ground, sense resistor 224 is located between the amplifier output node and the loudspeaker and is used to develop the voltage for the primary winding of transformer 220. The secondary winding of transformer 220 is connected between the non-inverting input of operational amplifier 212 and ground. Resistor 226 is used to terminate the transformer primary winding, and capacitor 228 is employed to control bandwidth.

In a typical arrangement of the current feedback circuit of FIG. 18, the turns ratio of transformer 220 and the gain set by resistors 214, 216, and 218 are selected such that a gain within a range of from about 0.5 to about 2 is applied to the input audio signal, and a gain in the range of about 10 to about 100 is applied to the current feedback voltage. In actual operating embodiments of the present invention, resistors 214, 216, and 218 were selected to have values of 16 KΩ, 12 KΩ, and between 1.2 KΩ–3 KΩ respectively. Those of ordinary skill in the art will readily be able to configure such a circuit for variations of the operating conditions disclosed herein.

Transformer 220 is phased such that either degenerative or regenerative feedback is obtained, with degenerative feedback being considered desirable for reduction of audible distortion and regenerative feedback being applicable in certain specialty applications such as guitar amplifiers. Those of ordinary skill in the art will appreciate that if regenerative feedback is employed, care must be taken to prevent the circuit from oscillating uncontrollably. Resistor 226 and capacitor 228 are selected such that the transformer is terminated into a matched resistive load for the particular transformer used and that the bandwidth of the feedback signal is limited to below about 30 KHz such that overall stable operation of the circuit is assured.

The output of the current feedback circuit drives voltage gain/phase splitter stage 14. As in amplifier 10 of FIG. 2, voltage gain/phase splitter stage 14 drives current drive stage 16 through bias adjustment stage 18. Current drive stage 16 drives an output stage 20 comprising paralleled individual output devices.

The circuit of FIG. 18 has certain advantages when the goal of employing current feedback is to cause the loudspeaker, through action of the power amplifier, to behave as if certain of its physical parameters have been altered.

By locating the sense resistor 224 between the output stage 20 and loudspeaker 222, and applying a feedback connection as shown, flat frequency response can be achieved. Since the current flowing in the loudspeaker system 222 must also flow in resistor 224 there will be a voltage developed across that resistor that represents the current flowing in the loudspeaker system, and which is useful in reducing audible distortion.

Those of ordinary skill in the art will recognize that the transformer connection disclosed in FIG. 18 may be replaced with an operational amplifier, configured as an ordinary differential amplifier to achieve the function of level shifting and common mode rejection required to apply the error signal developed across sense resistor 224 to the current feedback operational amplifier 212.

Those of ordinary skill In the art will recognize that operational amplifier 132 and its counterparts included in the disclosed power amplifier topology will require a bias voltage supply that is referenced to the output voltage point of the amplifier and that the reference, or center point, of this supply is required to float with respect to system ground, and to be driven to the limits of voltage excursion required by the audio output signal. As is known in the art, such a bias voltage source may also be configured as a temperature stable voltage source, which can therefore additionally perform the function of the stable reference 136 as referred to in this disclosure.

Such a bias supply may be realized in several ways familiar to those of ordinary skill in the art, two of which are illustrated in FIGS. 19*a* and 19*b*.

Referring now to FIGS. 19*a* and 19*b*, two schematic diagrams illustrate circuits for supplying bias voltages to the amplifier circuits disclosed herein. The bias supply circuit 230 of FIG. 19*a* includes a positive half comprising a resistor 232 in series with diode 234 and zener diode 236 all connected between the positive voltage rail V++ and the output node 238 of the audio amplifier. A filter capacitor 240 is connected in parallel with the zener diode 236. A negative half of the bias supply circuit 230 comprises a resistor 242 in series with diode 244 and zener diode 246 all connected between the negative voltage rail V-- and the output node 238 of the audio amplifier. A filter capacitor 248 is connected in parallel with the zener diode 246.

The bias supply circuit 250 illustrated in FIG. 19*b* utilizes a center tapped power transformer having the center tap connected to the output node 238 of the audio amplifier. A first rectifier diode 254 has its anode connected to one end of the secondary winding of transformer 252 and its cathode connected to positive output node 256. A filter capacitor 258 is connected between positive output node 262 and output node 238 of the audio amplifier. A second rectifier diode 260 has its cathode connected to the other end of the secondary winding of transformer 252 and its anode connected to negative output node 262. A filter capacitor 264 is connected between positive output node 256 and output node 238 of the audio amplifier.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An audio amplifier comprising:

a voltage feedback amplifier stage having an audio signal input;

a push-pull voltage gain/phase splitter stage driven from said voltage feedback amplifier stage;

a bias adjustment stage driven from said push-pull voltage gain/phase splitter stage;

a current drive stage driven from said bias adjustment stage;

an output stage driven from said current drive stage, said output stage comprising a plurality of paralleled current shared individual MOS output transistors driving an output node;

an output load having a first terminal connected to said output node and a second terminal connected to a fixed voltage potential;

a first voltage feedback loop comprising a voltage feedback stage having an input connected to a voltage divider driven from said first terminal of said load and an output connected to a feedback input node in said voltage feedback amplifier stage;

a second voltage feedback loop comprising a voltage feedback stage having an input connected to said output node and an output connected to a feedback input node in said push-pull voltage gain/phase splitter stage; and a third feedback loop comprising a current feedback stage having an input in series between said output node and said load and an output connected to a feedback input node in said voltage feedback amplifier stage.

\* \* \* \* \*